United States Patent [19]

Dunn et al.

[11] 4,431,873

[45] Feb. 14, 1984

[54] DIAPHRAGM DESIGN FOR A BENDER TYPE ACOUSTIC SENSOR

[75] Inventors: Robert G. Dunn, Dartmouth; Kenneth N. Barnard, West Petpeswick, both of Canada

[73] Assignee: Her Majesty the Queen in right of Canada, as represented by the Minister of National Defence, Ottawa, Canada

[21] Appl. No.: 328,648

[22] Filed: Dec. 8, 1981

[30] Foreign Application Priority Data

Jan. 9, 1981 [CA] Canada .................................. 368178

[51] Int. Cl.[3] ............................................ H01L 41/08

[52] U.S. Cl. ................................ 179/110 A; 367/165

[58] Field of Search ............... 179/110 A, 111 E, 116, 179/132, 133, 139; 310/330, 331, 337; 367/141, 155, 160, 161, 162, 163, 164, 165

[56] References Cited

U.S. PATENT DOCUMENTS

| | | | |
|---|---|---|---|
| 3,153,156 | 10/1964 | Watlington | 367/161 |
| 3,202,962 | 8/1965 | Elston | 367/165 |
| 3,255,431 | 6/1966 | Howatt | 367/165 |
| 3,970,878 | 7/1976 | Berglund | 367/160 |
| 3,988,620 | 10/1976 | McDavid | 367/160 |
| 4,051,455 | 9/1977 | Fowler | 367/163 |
| 4,347,593 | 8/1982 | Trott | 367/164 |

*Primary Examiner*—G. Z. Rubinson
*Assistant Examiner*—L. C. Schroeder
*Attorney, Agent, or Firm*—Stevens, Davis, Miller & Mosher

[57] ABSTRACT

An omnidirectional acoustic sensor has an air-backed diaphragm in a unit which has a central axis and is mounted so as to be responsive to acoustic pressure waves. A piezoelectric ceramic disc is attached to each face of the diaphragm. This combination forms a sensor unit whose acoustical and capacitive sensitivities are relatively independent of varying static pressure. The ceramic discs and diaphragm are each of a preselected size such that the ratio of disc diameter to diaphragm diameter is not greater than about 0.8. The sensor assembly further includes collar-like support means from which the diaphragm is supported. The sensor unit has a radius of zero stress, with the diaphragm being connected to the support means radially outwardly of the radius of zero stress. The ceramic discs lie within that radius of zero stress. In the preferred configuration the diaphragm and support means are the same piece of material. A sensor assembly is formed by securing two sensors together, the collar-like support means being joined together by axially facing surfaces thereof.

7 Claims, 6 Drawing Figures

DIAPHRAGM DESIGN FOR A BENDER TYPE ACOUSTIC SENSOR

This invention relates to an omnidirectional acoustic sensor, and more particularly to a diaphragm designed for a Bender type acoustic sensor, i.e., one in which the bending of a diaphragm under acoustical wave pressures energizes a piezoelectric element.

There are a number of instances when it is desirable to produce a small, reliable omnidirectional sensor. Such a sensor will ideally have good acoustic sensitivity and capacity, as well as being relatively insensitive to acceleration. Further, such a device should not have appreciable changes in acoustic sensitivity, or capacity, with changes in static pressure, e.g., with changes in depth.

To provide such characteristics prior devices have used relatively thick walls in a spherical shape. Moreover, the piezoelectric ceramics used therein had close tolerances. If assembled and mounted carefully, the acoustic and capacitive performances could be held relatively stable with respect to changes in static pressure. However, the device would be relatively sensitive to acceleration unless suitably supported.

Another approach used in attempting to meet the desired objectives involves the use of a pressure compensated sensor system. In such devices the pressure within the device is maintained equal to the ambient pressure outside of the device by using a mechanical-acoustic filter. The latter allows the transfer of fluids (gaseous or liquid) within the system to balance the static pressures inside and outside of the sensor. Such a device has acoustic response characteristics much dependent on the characteristics of the acoustic filter.

In both of the systems described very briefly above, the devices are fairly large in size, and costly to make. In other systems the use of an air-backed diaphragm enables responsiveness to acoustic pressures, but with a loss in stability of acoustic sensitivity and capacity with changes in static pressure.

It is known that when a piezoelectric ceramic disc or crystal is simply mounted on the pressure side of an air-backed diaphragm, acoustic sensitivity and capacity are greatly affected by the ambient static pressure. The reason for this is that as the pressure increases, the diaphragm is forced inward, i.e., to bend, thus changing the static stress within the disc. Subsequently, the sensitivity and capacity of the sensor also changes. In general, previous experience has taught that very significant changes in acoustic sensitivity and (electrical) capacity occur when ceramic discs are mounted in this fashion. Thus, it will be evident that prior devices have had certain shortcomings, depending upon the design approach used.

The present invention seeks to improve further on the prior art design of acoustic sensors. The devices embodying this invention are small in size, rugged and inexpensive to make. Further, acoustic sensors built according to the present invention have excellent stability of acoustic and capacitive sensitivity with changes in static pressure, combined with a low acceleration sensitivity. Still further, the outputs of a hydrophone using acoustic sensors of this invention can be optimized to suit specific requirements.

Accordingly, there is provided by this invention an omnidirectional acoustic sensor having an air-backed diaphragm in an assembly which has a central axis, the assembly being mounted so as to be responsive to acoustic pressure waves, wherein the improvement comprises a plurality of piezoelectric ceramic discs, one disc mounted on each face of the diaphragm to form therewih a sensor unit whose acoustical and capacitive sensitivities are relatively independent of varying static pressure, the discs and diaphragm being of a preselected size such that the ratio of disc diameter to diaphragm diameter is not greater than about 0.8. More preferably, the diaphragm and disc unit have a radius of zero stress taken from the central axis, beyond which radius the diaphragm is supported, and the disc lies within that radius.

Preferably the diaphragm and its support are integral.

In another preferred embodiment herein, the acoustic sensor is made up from a combination of two coaxially joined sensors of the type described above. Dependent on the electrical connections required to give the desired acoustic sensitivity and capacity (i.e., series connections or series-parallel connections) an insulating or a conducting joint is made between the axially oriented faces provided on each of the collar-like support means.

The various features and advantages of this invention will become more apparent from the detailed description below. That description is to be read in conjunction with the attached drawings which are illustrative only of a number of embodiments envisaged by this invention.

Figure 1:
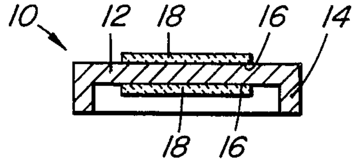
FIG. 1 is a side elevation view taken in cross-section diametrically of one embodiment of a sensor according to this invention.

Turning now to the drawings, FIG. 1 shows a sensor unit overall at 10. This unit 10 is made up of the combination of a diaphragm 12 supported peripherally thereof from a collar- or sleeve-like support means 14. The diaphragm 12 and its support are preferably integral to get away from an unpredictable adhesive joint at the critical area of the diaphragm boundary. The diaphragm 12 has opposed faces 16 on each of which there is mounted a piezoelectric ceramic disc 18 when suitably mounted and potted in a container in accordance with known techniques in the hydrophone art form a sensor unit which is air-backed. The diaphragm 12 is relatively thin, and is bendable in response to pressure waves striking the same, e.g., acoustic pressure waves. In bending, the diaphragm 12 energizes the piezoelectric elements or discs 18. This feature of an air-backed diaphragm is well known to persons skilled in this art. So too are the ways and structures by which the sensor unit 10 is mounted in a hydrophone housing or the like, and the wiring arrangements for deriving electrical signals from such units. Thus, no further references to those are needed here, for an understanding of this invention.

In accordance with this invention it has been found that the use of two piezoelectric ceramic discs 18 mounted one on each face 16 of the diaphragm forms a sensor unit 10 for which acoustic sensitivity and capacity are relatively independent of variations in the ambient static pressure. It has been found by experimentation that when a ceramic disc is mounted on the pressure side of an air-backed stainless steel diaphragm, and the ratio of ceramic disc diameter to diaphragm diameter is not greater than about 0.8, the acoustic sensitivity increases with pressure over the useful limit of the static pressure range which the diaphragm can withstand. At the same time the electrical capacity of the sensor unit decreases with increases in static pressure. Furthermore, it has been shown that if a similar piezoelectric ceramic disc is mounted on the air-backed face of the diaphragm the acoustic sensitivity of this inner element decreases with increase in the ambient static pressure, and its capacity will increase. The two piezoelectric ceramic discs 18 are electrically connected together to produce an output from sensor unit 10, in a manner well known to those skilled in the art of constructing acoustic sensors.

In the embodiment of FIG. 1, the diaphragm 12 is integrally formed with the collar-like support means 14. These are made from a metal such as aluminum, or preferably stainless steel. Moreover, these will be dimensioned to provide strength properties compatible with the static pressure ranges of the environment, e.g., depth under water, in which the unit is to be used. The ceramic discs 18 are joined to diaphragm 12 preferably by an adhesive. Other bonding/joining techniques can also be used.

Figure 2:
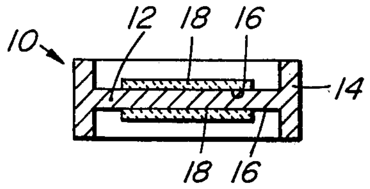
FIGS. 2, 3 and 4 are also elevation views taken in cross-section diametrically of some of the other embodiments envisaged by this invention.
Figure 3:
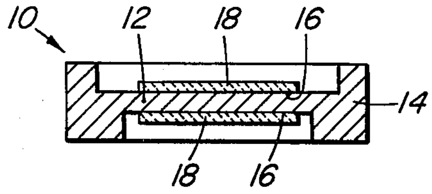

The collar-like support means 14 can be of varying construction, as seen from FIGS. 1, 2 and 3. Moreover, the discs 18, diaphragm 12 and support means 14 are normally circular in form, and have a common, longitudinally extending central axis. Thus, the same reference numerals identify the same parts in each of FIGS. 1, 2 and 3.

Figure 4:
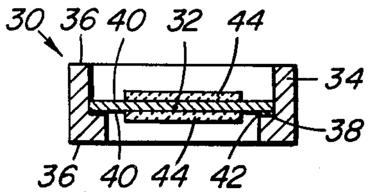

In FIG. 4, another embodiment of a sensor unit encompassed by this invention is shown overall at 30. The unit 30 is formed from the combination of an air-backed diaphragm 32 supported by its peripheral areas from collar-like support means 34. The support means 34 are constructed with end faces 36, and an axially facing shoulder or surface 38 provided on its interior. One face 40 of the diaphragm 32 is securely bonded to the shoulder 38 preferably by an adhesive 42. It is noted that in FIG. 4, the diaphragm 32 and support means 34 may be of the same or different materials, but are separate items before being bonded or joined together.

To explain one aspect of the present invention, the reader should note the following. Radial and tangential stresses in a diaphragm subjected to static pressure varies with radial position in the diaphragm. Hence, a piezoelectric ceramic disc fastened to the surface of a diaphragm will also have stresses therein which differ with radial position. Except for a free edge supported diaphragm—not usually a practical situation—the stress is greatest towards the axial center of the diaphragm. That stress decreases to zero at some position between the axial center and the edge of the diaphragm. Then moving outwards towards the edge of the diaphragm, the stress again increases in magnitude, but with opposite sign. The radius at which the stress reverses sign can be called the zero stress radius. By use of finite element analysis it is possible to define the approximate zero stress radius for a given diaphragm-ceramic element(s) combinations and edge restraints. In general it has been found to be a wise precaution to select a ceramic to diaphragm diameter ratio that will allow the ceramic to lie within the radius of zero stress, and thus obtain the optimum acoustic output from the sensor. However, unless precautions are taken, in many instances the zero stress radius for the ceramic on the pressure surface of the diaphragm will not be the same for the ceramic on the inner or air backed surface of the diaphragm, nor will the maximum stresses be the same in both ceramics.

Figure 5:
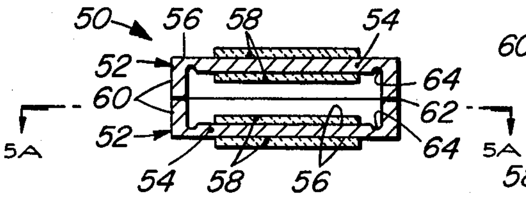
FIG. 5 is an elevation view, also taken in cross-section diametrically of the preferred features of the invention.
Figure 5A:
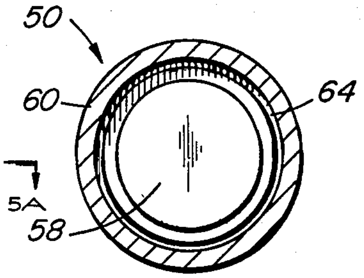
FIG. 5A is a plan view taken in section along line 5A—5A of FIG. 5.

In addition to the foregoing, other features of this invention will become apparent from the preferred embodiment shown in FIGS. 5 and 5A. There a sensor assembly 50 is seen to comprise two sensor units 52 which are joined integrally together, coaxially. Each sensor unit 52 includes a diaphragm 54 having faces 56 on each of which piezoelectric ceramic discs 58 are bonded. The diaphragms 54 and sleeve-like support means 60 are integral, i.e., one and the same piece of material. As readily seen from the drawing, the sensor units 52 are generally U-shaped in diametrically cross-section. Thus, the open tops of each unit 52 are bonded or joined together as seen at 62. This is preferably by means of an adhesive. The use with adhesive 62 of an electrical insulating material, much like a gasket, is optional. It is noted again that the diaphragms 54 and discs 58 are of a predetermined size, chosen such that the discs 58 lie within the so-called radius of zero stress noted above, and preferably with a disc to diaphragm diameter ratio less than about 0.8. A range of ratios is possible, e.g., 0.1 to 0.8 but the lower values would not be too practical, providing the maximum product of sensitivity and capacity per overall unit volume is to be maintained. The important factor is to keep within the stress crossover radius, a radius which is best determined by finite stress analysis, and verified by experimental testing.

In the context of designing for a particular radius of zero stress, it is also noted here that providing grooves as shown in FIG. 5 at 64 is useful in adjusting the stress behaviour in the ceramic discs 58, such that the stresses are more closely balanced. These grooves 64 are provided in the surfaces of diaphragms 54 which face each other, i.e., inwardly. With improved balancing of the stresses, the acoustic sensitivity and capacity of the output of the diaphragm-ceramic combination of sensor assembly 50, i.e., the two sensor units 52, is rendered more independent of ambient static pressure.

In general it has been found particularly beneficial to put a groove 64 into the inner surface of the diaphragm close to the inner circumference of the diaphragm support as shown in FIGS. 5 and 5A. This also tends to make the diaphragm into a free edge support case, and further reduces the importance of variations in the diaphragm support adhesive. By using ceramic discs with a radius smaller than the zero stress radius, acoustic sensors have been constructed that, within experimental errors, have shown constant acoustic sensitivity with static pressure changes over the range from atmospheric to approximately 500 psig, the very small capacity changes over the same pressure change. With some sacrifice in absolute sensitivity, it should be possible to extend this pressure range using similar techniques.

As stated earlier, the techniques for connecting the outputs from sensor units 52 (of FIG. 5) to provide minimum acceleration output will be familiar to those knowledgeable in the art of acoustic sensors. It will also be evident to such persons that the use of two diaphragms and four ceramic discs (as in FIG. 5) has an added advantage in averaging variations in the physical tolerances of the same. That can, for example, reduce the spread of individual hydrophone performance in a batch sample. This is of considerable practical importance as one of the prime causes of variations in the sensitivities of individual hydrophones and their capacity, is variations in the individual activity and capacitance of the piezoelectric ceramic elements.

As yet another advantage flowing from this invention, is that it is possible to use different materials for the diaphragm. The experiments were mostly made with stainless steel diaphragms when using the final preferred configuration. The same principles should apply to other materials, providing due care is taken not to overstress the material, and thus bend the ceramic disc beyond its acceptable stress limits. When that happens, permanent damage is done to the properties of the ceramic. The choice of material provides another parameter useable with the dimensional characteristics to optimize hydrophone outputs (i.e., of the sensor units/assemblies described above). It has been found on balance that the present invention leads to the construction of small, rugged and inexpensive hydrophones which have excellent stability of acoustic and capacitive sensitivities with changes in pressure, as well as a low acceleration sensitivity.

It is noted that the ceramic disc normally lies within the radius of zero stress. A unit whose disc diameter exceeds the diameter of zero stress would be operable, but have reduced sensitivity. In some instances for a hydrophone with a single disc per diaphragm, applied to the pressure side of the diaphragm, a trade-off between the correct radius of the ceramic to diaphragm ratio has been made to provide a higher capacity against a loss of sensitivity. Further, it would be practical to put a square, or triangular, or octagonalar, etc., ceramic or a circular diaphragm so that the square, etc., is contained within the line of zero stress of the combined ceramic and circular diaphragm, rather than try an odd shaped diaphragm.

The foregoing has described a preferred embodiment of this invention, as well as a number of alternatives. It is clear that other variations and forms will become apparent to persons skilled in this art. The present invention is intended to encompass all such forms and modifications as fall within the scope of the claims below.

The embodiments of the invention in which an exclusive property or privilege is claimed are defined as follows:

1. An omnidirectional acoustic sensor having an edge mounted air-backed diaphragm in an assembly which has a central axis, said assembly being mounted so as to be responsive to acoustic pressure waves, wherein the improvement comprises a plurality of piezoelectric ceramic discs, one disc mounted on each face of the diaphragm to form therewith a sensor unit whose acoustical and capacitive sensitivities are relatively independent of varying static pressure, the discs and diaphragm being of a preselected size such that the ratio of disc diameter to diaphragm is not greater than about 0.8 and the maximum radius of said discs further lies within the radius of zero stress of said diaphragm, said radius of zero stress being defined as that radius, measured from the center of said diaphragm where the stress is greatest, outwardly to the point on the diaphragm where the stress is at a minimum.

2. The acoustic sensor defined in claim 1, wherein said diaphragm is integrally connected to collar-like support means.

3. The acoustic sensor defined in claim 2, wherein said diaphragm is integrally joined to the collar-like support means at an axially oriented face of the same.

4. The acoustic sensor defined in claim 2 or 3, wherein the area of said diaphragm between the periphery of the ceramic discs and the support means includes stress controlling groove means, to control the stresses in said ceramic discs.

5. An omnidirectional acoustic sensor assembly in which two sensors as defined in claim 2 or 3 are co-axially connected one to another by their collar-like support means, the support means serving to maintain axial separation of the diaphragms under pressure.

6. An omnidirectional acoustic sensor assembly in which two acoustic sensors are provided, each as defined in claim 2 or 3, each said sensor being U-shaped in diametrical cross-section, said two sensors being adhesively connected together by axially oriented faces, so as to be disposed concentrically, the resultant sensor assembly being rectangularly shaped in diametrical cross-section, such a sensor assembly providing an averaging of variations in characteristics of the diaphragms and piezoelectric ceramic discs and minimizing acceleration output from the sensor assembly.

7. The acoustic sensor defined in claim 1, or 2, wherein the ceramic discs have a radius smaller than the radius of zero stress.

* * * * *